United States Patent [19]

Despax et al.

[11] Patent Number: 4,794,087
[45] Date of Patent: Dec. 27, 1988

[54] CIRCUIT WRITING PROCESS

[75] Inventors: Bernard Despax, Toulouse, France; Eric Kay, San Jose, Calif.

[73] Assignee: International Business Machines Corporation, Armonk, N.Y.

[21] Appl. No.: 940,879

[22] Filed: Dec. 9, 1986

Related U.S. Application Data

[63] Continuation of Ser. No. 786,413, Oct. 10, 1985, abandoned.

[51] Int. Cl.$^4$ .......................... G03G 13/00; G03G 5/00
[52] U.S. Cl. ....................................... 430/41; 430/311; 430/348; 430/945; 346/76 L
[58] Field of Search ................ 430/41, 311, 945, 348, 430/330; 427/53.1; 346/76 L

[56] References Cited

U.S. PATENT DOCUMENTS 3,894,869 7/1975 Goffe ............................... 430/41 X
4,252,890 2/1981 Haas et al. .......................... 430/292

Primary Examiner—José G. Dees
Attorney, Agent, or Firm—Joseph G. Walsh

[57] ABSTRACT

Circuit writing on a substrate is achieved by selectively exposing to a laser portion of a very thin film of a medium comprising electrically isolated conducting clusters in a dielectric matrix material. The preferred materials are gold in highly crosslinked polytetrafluoroethylene.

2 Claims, No Drawings

CIRCUIT WRITING PROCESS

This application is a continuation of copending application Ser. No. 786,413, filed Oct. 10, 1985, and now abandoned.

DESCRIPTION

1. Technical Field

The present invention is concerned with a process for writing an electrically conductive circuit on a substrate.

2. Background Art

U.S. Pat. No. 4,252,890 shows an imaging system involving agglomeration of particles. The system, however, is an optical imaging system and involves particles and matrixes much larger than those of the present invention.

DISCLOSURE OF THE INVENTION

According to the present invention, an electrically conductive circuit is written on a substrate by a totally non-chemical process comprising the steps of covering the substrate with a very thin film of a medium containing electrically isolated conducting clusters in a dielectric matrix material, irradiating selective portion of said medium with a laser and thereby causing migration of the conducting cluster and agglomeration of said clusters into conductive areas defined by the laser irradiation.

The substrate is first covered with a layer of dielectric matrix material having dispersed therein electrically isolated conducting clusters. The layer is very thin, typically about 1500 Å thick. The dispersed clusters of particles are from about 25 to 150 Å in size. It is an essential feature of the present invention that the conducting clusters and the dielectric matrix material be chemically non-reactive with each other to assure bulk conductivity in the final conducting pattern.

In carrying out the process of the present invention selective portions of the medium are irradiated with a laser. The laser causes thermally activated physical structure changes in the film media but causes no chemical reaction whatsoever. The final film is just as chemically stable after irradiation as it was before.

The dielectric cluster host matrix material is chemically inert. The most preferred material is a highly crosslinked polymer of tetrafluoroethylene deposited by vapor deposition.

The most preferred electrically conducting material for use as clusters are elemental metals; in particular, gold is the most preferred metal. Because of its chemical inertness, gold tends to remain in the pure metal state ultimately having bulk conductivity.

The film coverings in the present invention are typically about 1500 Å thickness. In order to prepare films less than 10000 Å in thickness and control dispersion uniformity as a function of thickness, the deposition should take place by vapor deposition. One preferred process in carrying out such a vapor deposition while simultaneously including dispersed metal particles is shown in U.S. Pat. No. 4,226,896, which is incorporated herein by reference.

As mentioned above, the preferred embodiment of the present invention is gold particles dispersed in polytetrafluoroethylene which is highly crosslinked. In various other imaging systems in the prior art, a laser has been used to melt a matrix and the granules so that granules can diffuse. This is in very sharp contrast to the present invention in which gold moves in the polytetrafluoroethylene matrix at a temperature of only 160° C., at which temperature the polytetrafluoroethylene undergoes a glass to rubber transition. This temperature of 160° C. is much lower than that of prior art migration systems involving melting. Because the temperature is so much lower, much less power is required, and this represents a very important advantage in the context of low temperature processing.

It should also be emphasized that the present process involves a system which comprises a single layer and, therefore, requires only a one-step deposition process. Prior art processes typically require multiple deposition steps.

Polytetrafluoroethylene, when deposited by vapor deposition such as shown in the above-mentioned U.S. Pat. No. 4,226,896, is highly crosslinked and particularly suited for archival storage purposes. Such crosslinked material also has the advantage of shrinking when heating. This shrinkage can amount to about 30% by volume. Less gold in the matrix as deposited is, therefore, required making the unirradiated areas more dielectric. Typically, the conducting metal clusters are present in the dielectric matrix at a volume ratio of about 15%.

Following the laser irradiation and agglomeration of the conductive particles, a conducting image is formed having a conductivity ten orders of magnitude greater than that of the non-radiated layer. The conductivity of the resultant gold is that of bulk gold.

The process of the present invention provides a very economical way to deposit select lines with adequately controlled stable electrical and mechanical properties. The process is suitable for multilevel fine line chip circuitry devices. The dry process of the present invention eliminates many processing steps currently employed in wet procedures. It thereby greatly reduces costs and results in high yield at a lower capital investment. Most importantly, the ability to repair circuits using laser beam addressed processing is achieved.

PREFERRED EMBODIMENT

A preferred way to form the films of the present invention is to use a conventional radio frequency (r.f.) capacitively coupled diode sputtering system in which the powered electrode surface consists of gold while the substrate, for example, quartz, sapphire or poly(methylmethacrylate) (P.M.M.A.), is in good thermal contact with the temperature controlled grounded coplanar anode electrode.

The plasma gas mixture is chosen so that the appropriate amount of Au is continuously sputtered off the powered electrode while at the same time polymer film is produced uniformly on the substrate into which the sputtered Au particles are trapped during film growth.

This condition is met by picking the appropriate flurocarbon monomer together with an appropriate inert sputtering gas so that polymerization dominates at the anode while at the same time metal sputtering dominates at the powered electrode. Polymerization on the Au electrode must be avoided.

Since the ratio of Au/polymer matrix in the final recording medium has to be within a certain range and since the film has to have a uniform dispersion of the metal clusters as a function of thickness, only special polymer forming gases mixed with the appropriate sputtering gases can be used.

Specifically, to obtain the right metal volume ratio and cluster size, the following conditions are used. A mixture of $C_3F_8/Ar$ in the ratio of $10^{-2}-5\times10^1$ is injected into the diode system at a flow rate of 10–20 s.c.c.m. at total gas pressure from 20–30m Torr. The r.f. discharge is run at 50 watts. The substrate temperature is maintained below 30° C. in order to obtain the desired reproducible metal/volume fraction and cluster size from run to run.

The resultant recording medium consists of a highly uniform dispersion of small Au clusters in a highly crosslinked fluorocarbon plasma-polymerized matrix. The films consist of stable ingredients which have excellent archival characteristics. The films are pinhole free and uniform. The films adhere well to a number of different substrates.

The laser used was an unfocused $Kr^+$ laser at $\sim 647$ nm adjusted to deliver $\geq 2\times 10^4$ watts/cm$^2$ to the film surface. Laser irradiation produced a material which changed its electrical conductivity by eight orders of magnitude, from $10^3$ $\Omega$cm to $3\times 10^{-6}$ $\Omega$cm.

The time to expose a $40\mu\times40\mu$ spot was 0.5 sec. It should be noted that the process was carried out in air, unlike many prior art procedures which must be carried out in vacuum.

We claim:
1. A dry process for circuit writing on a substrate consisting of the steps:
    (1) covering the substrate with a medium of about 1,500 Angstroms thickness comprising electrically isolated conducting clusters of gold from about 25 to about 150 Angstroms in size in a dielectric matrix material which is a highly cross-linked polytetrafluoroethylene, and
    (2) irradiating selected portions of said medium with a laser whereby migration of the conduction clusters and aggregation of said clusters into conducting areas takes place in the areas divided by the laser radiation.
2. A process as claimed in claim 1 wherein the conducting clusters are present in the dielectric matrix material at a volume ratio of about 15%.

* * * * *